United States Patent [19]

Hiki

[11] Patent Number: 4,778,771

[45] Date of Patent: Oct. 18, 1988

[54] PROCESS OF FORMING INPUT/OUTPUT WIRING AREAS FOR SEMICONDUCTOR INTEGRATED CIRCUIT

[75] Inventor: Yoshimasa Hiki, Tokyo, Japan

[73] Assignee: NEC Corporation, Japan

[21] Appl. No.: 829,424

[22] Filed: Feb. 12, 1986

[30] Foreign Application Priority Data

Feb. 14, 1985 [JP] Japan ............................... 60-27063

[51] Int. Cl.⁴ ........................................... G01R 31/26
[52] U.S. Cl. ..................................... 437/8; 437/51; 437/204; 324/158 T
[58] Field of Search ............................ 437/8, 51, 204; 324/158 T

[56] References Cited

U.S. PATENT DOCUMENTS

| | | | |
|---|---|---|---|
| 3,795,973 | 3/1974 | Calhoun | 437/8 |
| 3,795,975 | 3/1974 | Calhoun et al. | 437/8 |
| 3,849,872 | 11/1974 | Hubacher | 437/8 |
| 3,940,740 | 2/1976 | Coontz | 437/8 |
| 3,981,070 | 9/1976 | Buelow et al. | 437/8 |
| 4,104,785 | 8/1978 | Shiba et al. | 29/574 |
| 4,243,937 | 1/1981 | Multani et al. | 324/158 T |
| 4,691,434 | 9/1987 | Percival et al. | 437/173 |

Primary Examiner—Olik Chaudhuri
Attorney, Agent, or Firm—Laff, Whitesel, Conte & Saret

[57] ABSTRACT

A process of fabricating a semiconductor integrated circuit wherein a plurality of device-forming areas are formed on a semiconductor wafer, whereupon, interconnection wiring patterns are formed on the device-forming areas, respectively, so that each of the device-forming areas and the interconnection wiring pattern on the particular device-forming area form an incomplete integrated circuit portion. Each of the incomplete integrated circuit portions is then inspected for defects in functions and capabilities thereof, whereupon input-/output terminal wiring patterns are formed only for those of the incomplete integrated circuit portions which have been determined to be acceptable as a result of the inspection step.

5 Claims, 5 Drawing Sheets

PROCESS OF FORMING INPUT/OUTPUT WIRING AREAS FOR SEMICONDUCTOR INTEGRATED CIRCUIT

FIELD OF THE INVENTION

The present invention relates to a process of fabricating semiconductor integrated circuit devices, typically, those which are to form logic gate arrays.

BACKGROUND OF THE INVENTION

Description of the Prior Art

In FIG. 1 of the drawings is shown in model form the cross sectional configuration of a semiconductor device structure 10 fabricated by a known semiconductor device process. The device structure 10 includes a semiconductor wafer 12 having a plurality of independent device-forming areas which are commonly represented by 14. On top of these device-forming areas 14 are provided interconnection wiring areas 16 which overlie the device-forming areas 14, respectively. The interconnection wiring areas 16 are arranged to be in contact with the individual device-forming areas 14. The wiring areas 16 in turn are respectively overlain by input/output terminal wiring areas 18 which selectively provide electrical connections to and from the individual interconnection wiring areas 16. Those of the device-forming areas 14, interconnection wiring areas 16 and input/output terminal wiring areas 18 which are shown vertically aligned together are assumed to form individual integrated circuit units or semiconductor chips.

FIGS. 2A and 2B of the drawings show the cross sectional configurations, at different stages of device fabrication process, of one of such integrated circuit units. At the beginning of the process stage illustrated in FIG. 2A, the semiconductor integrated circuit unit includes a semiconductor substrate 12' which forms part of the wafer 12 in the semiconductor device structure 10 shown in FIG. 1. On this semiconductor substrate 12' is provided a device-forming area including, by way of example, a plurality of bipolar transistor devices 14a and 14b and a plurality of resistor devices 14c and 14d. The transistor devices 14a and 14b and resistor devices 14c and 14d are isolated from one another by isolation regions 20 and are jointly covered with an interlevel insulator layer 22 which has a plurality of via holes 24 extending to the surfaces of the transistor and resistor devices 14a, 14b, 14c and 14d. These transistor devices 14a and 14b and resistor devices 14c and 14d form part of the device-forming areas 14 in the semiconductor device structure 10 shown in FIG. 1.

Turning to FIG. 2B, there are provided a plurality of interconnection wiring patterns 16' of metal which connect the transistor devices 14a and 14b and resistor devices 14c and 14d through the via holes 24 each other. The interconnection wiring patterns 16' for the transistor and resistor devices 14a, 14b, 14c and 14d as well as those portions of the interlevel insulator layer 22 as herein shown form one of the interconnection wiring areas 16 of the semiconductor device structure 10 illustrated in FIG. 1. The interconnection wiring patterns 16' and these portions of the interlevel insulator layer 22 are covered with a toplevel insulator layer 26 which has a plurality of via holes 28 extending to the surface of the interconnection wiring pattern 16'. On the interconnection wiring area is provided a plurality of input/output terminal wiring pstterns 18' of metal which overlie portions of the toplevel insulator layer 26 and which are selectively connected to the interconnection wiring patterns 16' through the via holes 28 in the insulator layer 26. The input/output terminal wiring patterns 18' form each of the input/output terminal wiring areas 18 of the semiconductor device structure 10 shown in FIG. 1.

FIG. 3 shows the general configuration in plan of the semiconductor integrated circuit unit thus fabricated at the end of the process stage illustrated in FIG. 2B, wherein the semiconductor integrated circuit unit as a whole is denoted by 30 and is shown having a device-forming area 32. The device-forming area 32 is assumed to be defined by the device regions 14a, 14b, 14c and 14d depicted in FIG. 2B and is shown surrounded by an input/output terminal area 34 including a number of input/output terminal pads 36 which are typically arranged along the edges of the integrated circuit unit 10 as shown. The input/output terminal area 34 forms part of each of the input/output terminal wiring areas 18 of the semiconductor device structure 10 shown in FIG. 1 with the input/output terminal pads 36 respectively leading from the input/output terminal wiring patterns 20'. The input/output terminal wiring patterns 18' also lie at the surface of the device structure 10 but these wiring patterns 18' are not herein shown for simplicity of illustration.

Assume, now, that the semiconductor integrated circuit unit 30 as a whole is square-shaped in plan and has a length Lc for each side thereof and that the device-forming area 32 in the integrated circuit unit 10 is also square-shaped in plan and has a length Ld for each side thereof as shown in FIG. 3. The length Ld of the sides of the device-forming area 32 must be considerably less than the length Lc of the sides of the integrated circuit unit 30 in order to provide an allowance for forming the input/output terminal area 34 over which the input/output terminal pads 36 are to be arranged along each side of the circuit unit 30. Assuming further that the integrated circuit unit 30 under consideration is provided as a logic gate array, the number P of the pins, viz., the input/output terminal pads 36 to be provided for the integrated circuit unit 30 is, as well known in the art, given by the formula:

$$P = KG^n,$$

where K is a constant approximating 0.2, G is the number of the logic functions incorporated in the array, viz., the gates provided in the integrated circuit unit 30, and n is a constant approximating 0.6. If the integrated circuit unit 30 has 1000 logic gates, by way of example, then the number P of the input/output terminal pads 36 to be provided for the circuit unit 30 should be about 127 from the above formula, which means that a total of about 160 input/output terminal pads 36 are required including the terminal pads for the power supply. This in turn means that the particular integrated circuit unit 30 should be sized to have 40 input/output terminal pads 36 along each of its sides. In order that these input/output terminal pads 36 be wire bonded to the substrate of the chip package at a subsequent stage of device fabrication process, the individual input/output terminal pads 36 to be provided along each side of the integrated circuit unit 30 must be arranged at a pitch (represented by Pt in FIG. 3) of about 300 microns. To realize such arrangement of the input/output terminal pads 36, the length Lc of each side of the semiconductor integrated circuit unit 30 must be approximately $$0.3 \text{ mm} \times 39 + 1.0 \text{ mm} = 12.7 \text{ mm}$$

in consideration of the additional length of about 1.0 mm required for providing an allowance for each of the corner portions at the opposite ends of each side.

On the other hand, it is well known that the length Ld of each side of the device-forming area 32 can be made less than 7 mm for a semiconductor integrated circuit unit having 1000 logic gates. This means that the share of the input/output terminal area 34 in the total area of the integrated circuit unit 30 is about 5.7 mm (=12.7−7) in length along each side and about 112 mm$^2$ (=12.7$^2$−7$^2$) in area. This in turn means that the input/output terminal area 34 accounts for about 230 percent of the device-forming area 32 which is equal to about 1/3.3 of the total area (=approx. 161 mm$^2$) of the integrated circuit unit 30. The input/output terminal area 34 is thus larger than the device-forming area 32 and, indeed, only less than one-third of the total area of the integrated circuit unit 30 can be utilized for the device-forming area 32.

As the integration density is increased for logic gate arrays formed by semiconductor integrated circuit units, the share of the input/output terminal area in the total area of each integrated circuit unit increases progressively and requires substantial reduction in the number of the integrated circuit units 30 which can be provided in a single wafer. This results in reduction in the yield of the integrated circuits to be fabricated.

OBJECTS OF THE INVENTION

It is, accordingly, an object of the present invention to provide process of fabricating a semiconductor integrated circuit featuring a larger geometry for the device-forming area of the device and capable of incorporating a larger number of devices with use of a wafer similar to those which have been used to date.

It is another object of the present invention to provide a device fabrication process in which there is no need of forming input/output terminal wiring patterns for the integrated circuits found to be involving defects in functions and capabilities in the course of the fabrication process.

It is, thus, a prime object of the present invention to provide an improved device fabrication process which will contribute to the saving of the production cost of semiconductor integrated circuits, particularly, those forming logic gate arrays and to achieving increased throughputs for the production of such semiconductor devices.

SUMMARY OF THE INVENTION

In accordance with the present invention, there is provided a process of fabricating a semiconductor integrated circuit comprising the steps of (a) preparing a semiconductor wafer; (b) forming a plurality of device-forming areas on the wafer; (c) forming interconnection wiring areas on the device-forming areas, respectively; (d) inspecting each of the incomplete integrated circuit portions for defects in functions and capabilities; and (e) forming input/output terminal wiring areas only for those of the incomplete integrated circuit portions which have been determined to be acceptable as a result of the inspection step. Each of the input/output terminal interconnection wiring areas is preferably formed in part substantially throughout the area of each of the incomplete integrated circuit portions determined to be acceptable by the inspection step and in part in the areas of the incomplete integrated circuit portions which have been determined to be involving any of the defects by the inspection step and which are located contiguously to each of the incomplete integrated circuit portions determined to be acceptable. In this instance, each of the input/output terminal wiring areas may include input/output terminal pads located within the areas of the incomplete integrated circuit portions which have been determined to be involving any of the defects by the inspection step. Each of such input/output terminal interconnection wiring areas may comprise conductor regions which include interconnection wiring patterns electrically connected to the device-forming areas and to the input/output terminal pads.

BRIEF DESCRIPTION OF THE DRAWINGS

The features and advantages of a process of fabricating a semiconductor integrated circuits in accordance with the present invention will be more clearly understood from the following description taken in conjunction with the accompanying drawings in which like reference numerals designate similar or corresponding units, elements and regions in which.

DESCRIPTION OF THE PREFERRED EMBODIMENT

Figure 1:
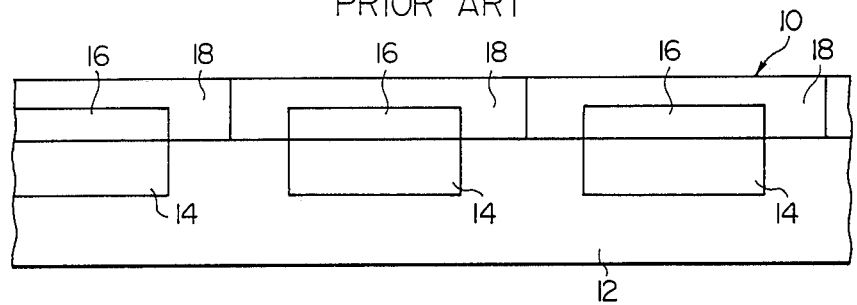
FIG. 1 is a schematic cross sectional view showing in model form a portion of a semiconductor device structure fabricated by a prior-art semiconductor device process.
Figure 2A:
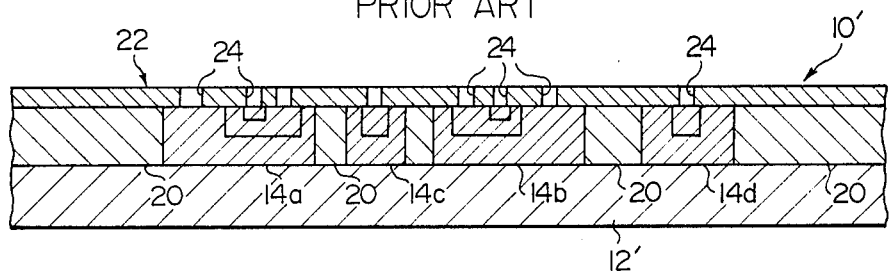
FIGS. 2A and 2B are fragmentary cross sectional views showing the construction, at different stages of semiconductor device fabrication process, of a specific example of a semiconductor device structure basically similar to the device structure modelled in FIG. 1.
Figure 2B:
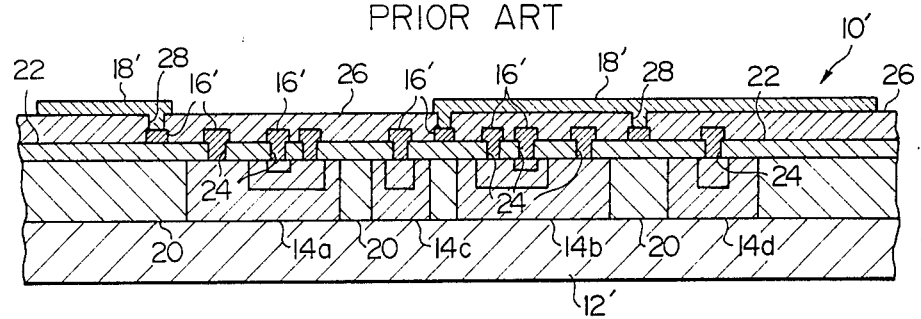
Figure 3:
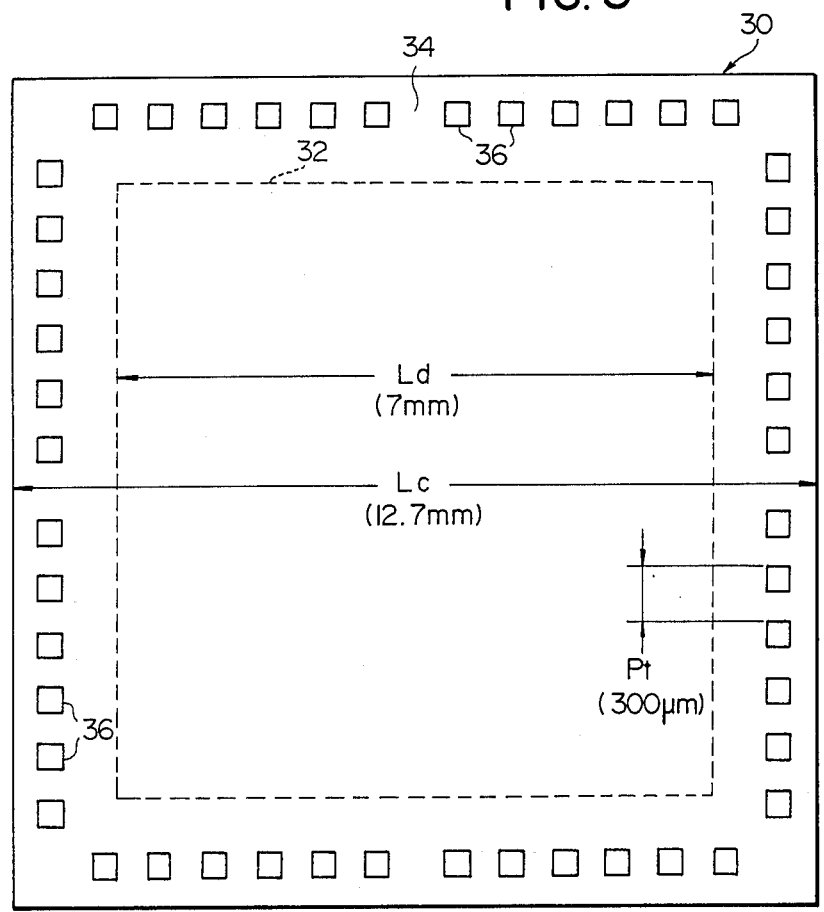
FIG. 3 is a plan view of the semiconductor device structure fabricated by the process including the process stages illustrated in FIGS. 2A and 2B.
Figure 4:
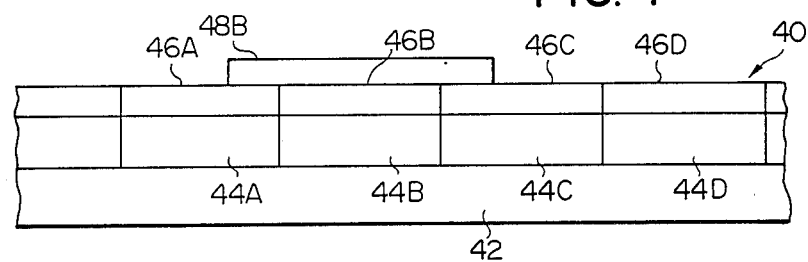
FIG. 4 is a schematic cross sectional view showing in model form a portion of a semiconductor device structure fabricated by a semiconductor device process according to the present invention.

In FIG. 4 of the drawings is shown in model form the cross sectional configuration of a semiconductor device structure 40 fabricated by a process according to the present invention to accomplish these objects. The device structure 40 comprises a semiconductor wafer 42 having a plurality of independent device-forming areas including those indicated at 44A, 44B, 44C and 44D. On top of these device-forming areas are formed interconnection wiring areas including wiring areas indicated at 46A, 46B, 46C and 46D which overlie the deviceforming areas 44A, 44B, 44C and 44D, respectively. The interconnection wiring areas 46A, 46B, 46C and 46D are arranged to be in contact with the individual device-forming areas 44A, 44B, 44C and 44D, respectively. After the interconnection wiring areas 46A, 46B, 46C and 46D have thus been formed on the device-forming areas 44, the device structure which is incomplete at this stage of process is inspected to see if any of the integrated circuit portions involves defects in functions and capabilities. In the device structure shown in FIG. 4, it is assumed for purposes of description that only the integrated circuit portion including the device-forming area 44B and interconnection wiring area 46B has been found acceptable and the others of the integrated circuit portions shown found involving functional defects. Thus, an input/output terminal wiring area 48B is formed on the interconnection wiring area 46B of the particular integrated circuit portion as shown to provide electrical connections to and from the individual interconnection wiring patterns included in the interconnection wiring area 46B.

Figure 5A:
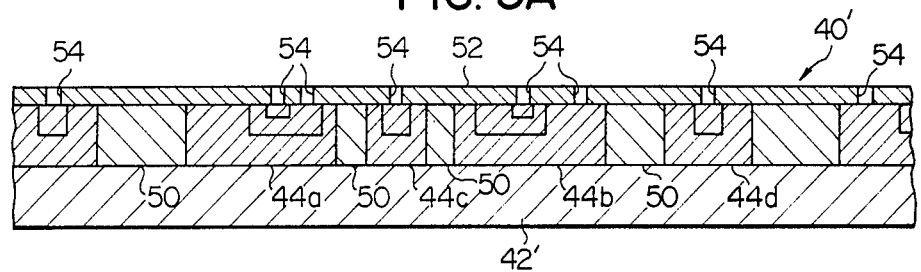
FIGS. 5A to 5C are fragmentary cross sectional views showing the construction, at different stages of semiconductor device fabrication process, of a specific example of a semiconductor device structure basically similar to the device structure modelled in FIG. 4.
Figure 5B:
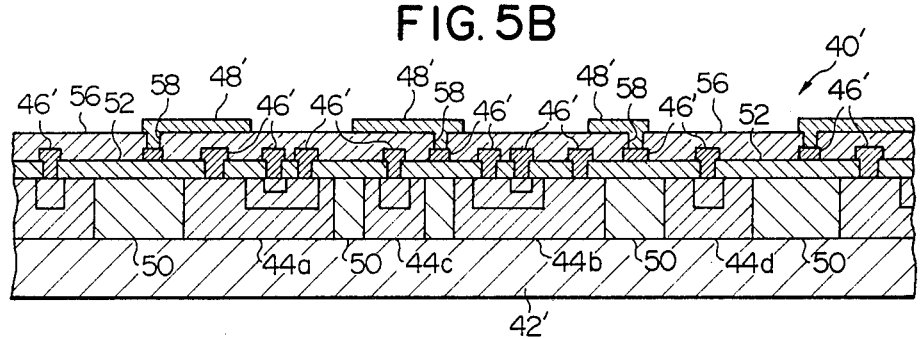
Figure 5C:
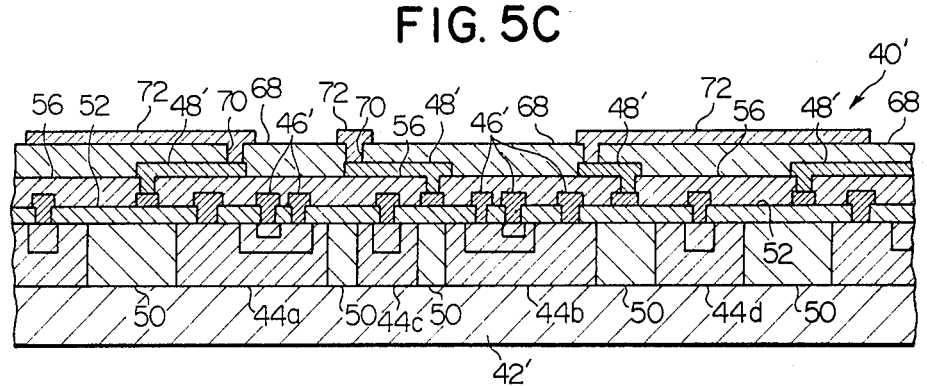

FIGS. 5A to 5C of the drawings show the cross sectional configurations, at different stages of device fabrication process, of a practical example of the integrated circuit portion thus complete with the device-forming area 44B, interconnection wiring area 46B and input/output terminal wiring area 48B shown in FIG. 4. At the beginning of the process stage illustrated in FIG. 5A, the semiconductor integrated circuit portion, denoted in its entirety by reference numeral 40', includes a semiconductor substrate 42' which forms part of the wafer 42 in the semiconductor device structure 40 shown in FIG. 4. The device-forming area 44B on this semiconductor substrate 42' is herein assumed to include a plurality of active devices represented by bipolar transistor devices 44a and 44b and a plurality of passive devices represented by resistor devices 44c and 44d which are associated with the transistor devices 44a and 44b, respectively. The transistor devices 44a and 44b and resistor devices 44c and 44d are isolated from one another by isolation regions 50 and are jointly covered with an interlevel insulator layer 52 which has a plurality of via holes 54 extending to the surfaces of the transistor and resistor devices 44a, 44b, 44c and 44d, such via holes 54 being typically formed by well known microlithographic etching techniques. These transistor devices 44a and 44b and resistor devices 44c and 44d form the device-forming area 44b in the semiconductor device structure 40 shown in FIG. 4 and, accordingly, form part of the accepted circuit portion in the modelled semiconductor device structure 40.

Turning to FIGS. 5B and 5C, a plurality of interconnection wiring patterns 46' of metal are formed through the via holes 54 in the interlevel insulator layer 52 for direct contact with the transistor devices 44a and 44b and resistor devices 44c and 44d, respectively. Furthermore, a plurality of interconnection wiring patterns 48' are formed on the insulator layer 56 and are connected to the interconnection wiring patterns 46' through the via holes 54. The interconnection wiring patterns 46' and 48', insulator layers 52 and 56 as herein shown form the interconnection wiring area 46b of the semiconductor device structure 40 illustrated in FIG. 4. The interconnection wiring patterns 46' and 48' and these portions of the interlevel insulator layers 52 and 56 are covered with an insulator layer 68 which has a plurality of via holes 70 extending to the surface of the interlevel insulator layer 68, the via holes 70 being also typically formed by known microlithographic etching techniques.

Figure 6:
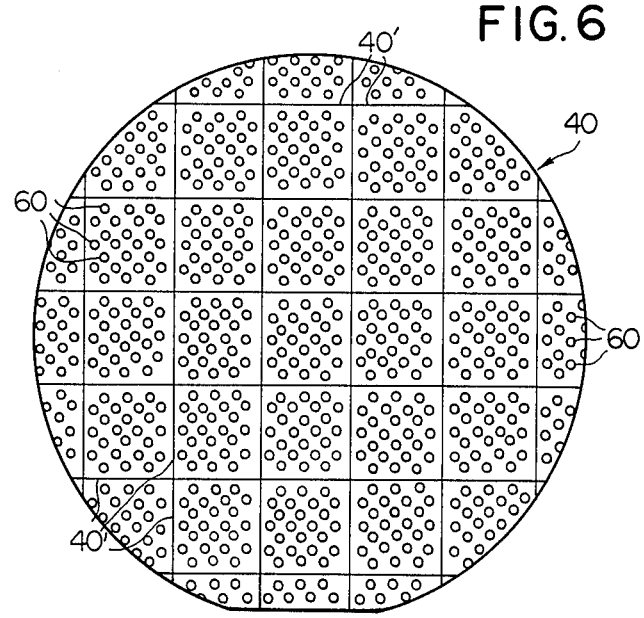
FIG. 6 is a plan view of the semiconductor device structure fabricated during the process including the process stages illustrated in FIGS. 5A to 5C.

In the process according to the present invention, the interconnection wiring regions 48' include those which are to be used as testing pads for the inspection of the functions and capabilities of the integrated circuit portion 40' which is incomplete at this stage of fabrication process. FIG. 6 of the drawings shows a semiconductor device structure 40 composed of a number of incomplete integrated circuit portions 40' each formed with a plurality of such testing pads which in particular are herein designated by reference numeral 60. Some of the integrated circuit portions 40' of the device structure 40 herein shown correspond to the integrated circuit portions of the device structure 40 illustrated in FIG. 4 and, thus, each of these integrated circuit portions 40' is assumed to have the cross sectional configuration of the integrated circuit portion 40' depicted in FIG. 5B. In FIG. 6, the testing pads 60 are assumed to be arranged in matrix form and those of the interconnection wiring patterns 48' which are to be used exclusively as such are not shown for simplicity of illustration.

Figure 7:
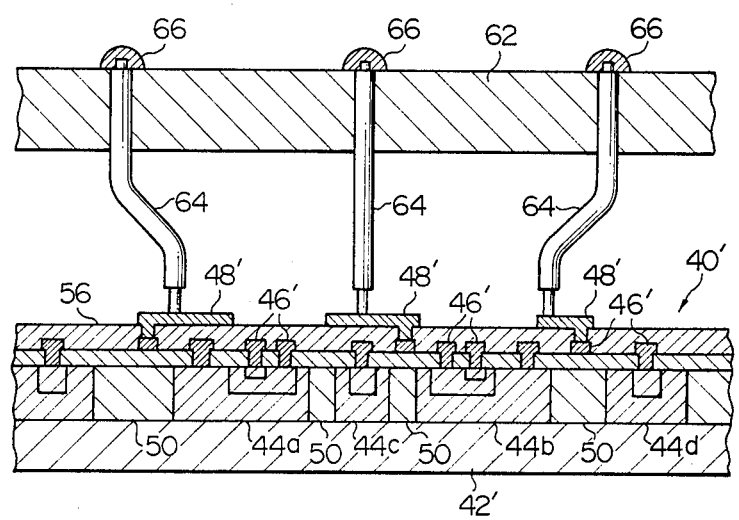
FIG. 7 is a fragmentary cross sectional view showing an example of the arrangement in which the device structure obtained at the process stage illustrated in FIG. 5B is to be tested for defects in functions and capabilities during the process according to the present invention.

FIG. 7 of the drawings shows a portion of a typical example of the wafer diagnostic arrangements which can be used for the inspection of these incomplete integrated circuit portions 40'. A metal-probe system is herein used which includes a test card 62 having a plurality of metal probes 64 electrically connected through connectors 66 to a suitable testing equipment. After the wafer forming the device structure 40 is brought into a correct position in the testing system, the testing probes 64 are held in contact with the individual testing pads 60 of each of the integrated circuit portions 40' and inspect each integrated circuit portion 40' for various electrical characteristics of the integrated circuit portion. The testing pads 60 are used exclusively for the diagnostic purposes and are to be used neither as input/output terminal pads. The testing pads 60 provided in a semiconductor device structure fabricated by the process according to the present invention are thus entirely free from the various restrictions which are ordinarily placed on the input/output terminal pads of semiconductor chips. While, for one thing, the input/output terminal pads which form part of input/output terminal wiring patterns of a semiconductor chip must be located along each side of the chip for being wire bonded to the substrate of the chip package, the testing pads 60 of the interconnection wiring patterns 48' need not be localized along each side of the chip and can be distributed throughout the area of the chip as shown in FIG. 6 although this is not a requirement of the process according to the present invention.

On the incomplete integrated circuit portion 40' which has thus been determined to be clear of any defects by the testing operation conducted as above described is then provided a second or upper layer of the input/output terminal wiring area 48b of the semiconductor device structure 40 shown in FIG. 4. As illustrated in FIG. 5c, the second or upper layer of the input/output terminal wiring area 48b includes an insulator layer 68 formed in part on the surface of the second interlevel insulator layer 56 and in part on the surfaces of the interconnection wiring regions 48'. The insulator layer 68 has a plurality of via holes 70 extending to the surfaces of all the interconnection wiring patterns 48'. The insulator layer 68 thus forms a toplevel insulator layer of the semiconductor integrated circuit portion 40'. A plurality of input/output terminal wiring patterns 72 of metal overlie portions of this toplevel insulator layer 68 and are selectively connected to the interconnection wiring patterns 48' through the via holes 70 in the insulator layer 68.

Figure 8:
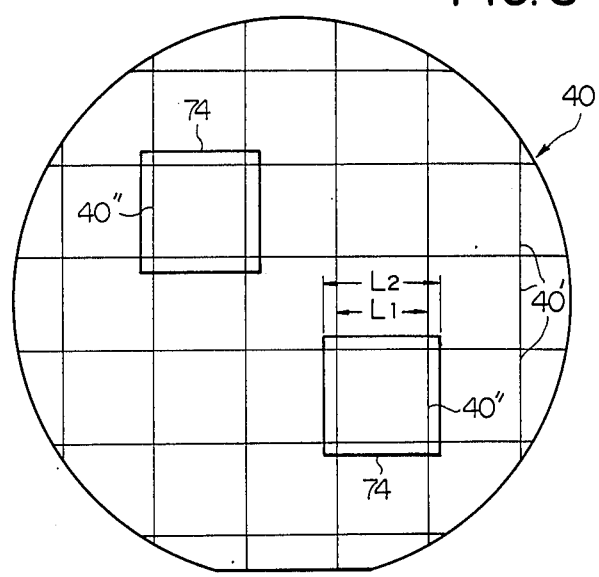
FIG. 8 is a schematic plan view of the semiconductor device structure fabricated by the process according to the present invention.
Figure 9:
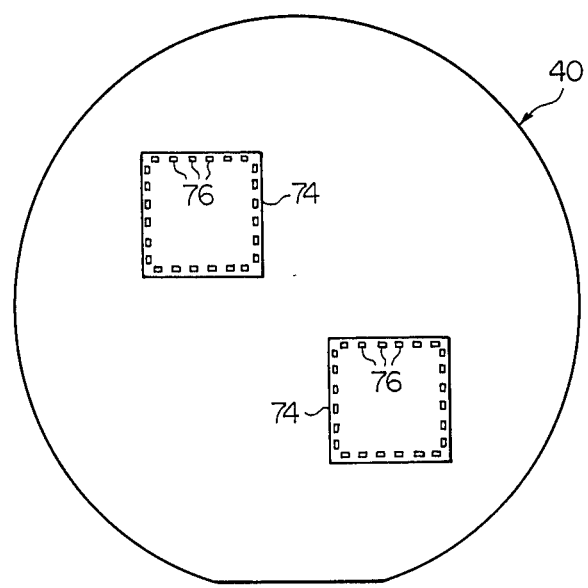
FIG. 9 is an external plan view of the semiconductor device structure illustrated in FIG. 8.

FIG. 8 shows the general configuration in plan of the wafer forming the semiconductor device structure 40 thus fabricated. Among the integrated circuit portions 40' of the wafer which have been subjected to the probe tests, only the integrated circuit portions herein indicated at 40" are assumed to have been determined acceptable as a result of the tests and thus form integrated circuit units 74 complete with the input/output terminal wiring regions which are represented by input/output terminal pads 76 in FIG. 9. As will be seen from FIG. 8, each of the complete integrated circuit units 74 has its device-forming area defined by the total area initially assigned to each of the accepted integrated circuit portions 40" per se and has an input/output terminal pad formed by portions of the eight rejected integrated circuit portions 40' contiguous to the four sides and four corners of the accepted integrated circuit portion 40'. Thus, the input/output terminal pads 76 of the complete integrated circuit units 74 as shown in FIG. 9 are located in marginal portions of these rejected, hence otherwise useless eight integrated circuit portions 40' located outside the initial area of the accepted integrated circuit portion 40". Assume now that each of the integrated circuit portions 40' of the device structure 40 has a length $L_1$ along each of its sides and the complete integrated circuit unit 74 has a length $L_2$ along each of its sides as shown in FIG. 8. In this instance, the $L_2$ of each side of the complete integrated circuit unit 74 is apparently larger than the $L_1$ of each side of each integrated circuit portion 40'.

As will be seen from the foregoing description, the integrated circuit fabricated by the process according to the present invention is characterized in that only the accepted integrated circuit portion has input/output terminal interconnection wiring areas including conductor regions which electrically connects the device-forming areas 44B and to the input/output terminal pads 76.

The input/output terminal wiring pattern 72 (FIG. 5C) for the integrated circuit portions 40" determined to be acceptable by the probe tests are formed on selected ones of the integrated circuit portions 40', viz., the accepted integrated circuit portions 40" of the device structure 40 by the use of a step-and-repeat reduction projection system in accordance with the control information formulated on the basis of the test results memorized in the projection system. The integrated circuit units 74 completed in this fashion are either mechanically or optically scribed from the wafer and are incorporated into suitable packages.

As will have been understood from the foregoing description, an integrated circuit unit fabricated by the process according to the present invention provides a larger geometry for the device-forming area of the unit and is for this reason capable of incorporating the larger number of integrated circuit units with use of a wafer similar to those which have been used to date. Another advantage of the process according to the present invention is that there is no need of forming input/output terminal areas for the integrated circuit portions which have been found objectionable during the process. This will contribute to the saving of the production cost of logic gate arrays and to achieving increased throughputs for the production of such semiconductor devices.

What is claimed is:

1. A process of forming input/output wiring areas on a semiconductor integrated circuit, the process comprising the steps of
   (a) preparing a semiconductor wafer;
   (b) forming a plurality of device-forming areas on the wafer, each of the device-forming areas including a plurality of functional devices, the device-forming areas being arranged in a matrix form on the wafer;
   (c) forming interconnection wiring areas on said device-forming areas, respectively, each of said device-forming areas and the interconnection wiring area on each device-forming area providing an incomplete integrated circuit portion;
   (d) inspecting each of the incomplete integrated circuit portions for defects in functions and capabilities of the functional devices included in each device-forming area, determining that said inspected portions are acceptable or nonacceptable; and
   (e) forming input/output terminal areas for only those of said incomplete integrated circuit portions which have been determined to be acceptable as a result of the inspection step, each of said input/output terminal areas being formed in part substantially throughout the area of each of the incomplete integrated circuit portions determined in step (d) to be acceptable and in part in the areas of the incomplete integrated circuit portions which have been determined in step (d) to have said defects and which are located contiguously to each of said incomplete integrated circuit portions determined in step (d) to be acceptable, each of said input/output terminal areas comprising input/output terminal pad regions located within said areas of the incomplete integrated circuit portions which have been determined in step (d) to have said defects, wherein the input/output termional pad regions for the incomplete integrated circuit portions determined in step (d) to be acceptable are retained in situ within the respective input/output terminal areas.

2. A process as set forth in claim 1, in which each of said input/output terminal areas comprises conductor regions which include interconnection wiring areas electrically connected to said device-forming areas and to said input/output terminal pad regions.

3. A process as set forth in claim 2, in which said input/output terminal pad regions include testing pad regions which are located within the area of each of the incomplete integrated circuit portions determined in step (d) to be acceptable.

4. A process of forming input/output wiring areas on a semiconductor integrated circuit, the process comprising the steps of
   (a) preparing a semiconductor wafer;
   (b) forming a plurality of device-forming areas on the wafer, each of the device-forming areas including a plurality of functional devices, the device-forming areas being arranged in a matrix form on the wafer;
   (c) forming interconnection wiring areas on said device-forming areas, respectively, each of said device-forming areas and the interconnection wiring area on each device-forming area providing an incomplete integrated circuit portion;

(d) inspecting each of the incomplete integrated circuit portions for defects in functions and capabilities of the functional devices included in each device-forming area, determining that said inspected portions are acceptable or nonacceptable; and (e) forming input/output terminal areas for only those of said incomplete integrated circuit portions which have been determined to be acceptable as a result of the inspection step, in which each of said input/output terminal areas is formed in part substantially throughout the area of each of the incomplete integrated circuit portions determined in step (d) to be acceptable and in part in the areas of the incomplete integrated circuit portions which have been determined in step (d) to have said defects and be non-acceptable and which are located contiguously to each of said incomplete integrated circuit portions determined in step (d) to be acceptable, wherein each of said input/output terminal areas comprises input/output terminal pad regions located within said areas of the incomplete integrated circuit portions which have been determined in step (d) to have said defects, and interconnection wiring areas electrically connected to said device-forming areas and to said input/output terminal pad regions, said input/output terminal pad regions including testing pad regions which are distributed substantially throughout each of said device-forming areas and which are located within the area of each of the incomplete integrated circuit portions determined in step (d) to be acceptable, wherein the input/output terminal pad regions for the incomplete integrated circuit portions determined in step (d) to be acceptable are retained in situ within the respective input/output terminal areas.

5. A process as set forth in claim 4, further comprising the step of forming in at least part of each of said input/output terminal areas an insulator covering a portion of each of said testing pad regions and a plurality of input/output terminal wiring regions overlying said insulator layer and electrically connected to the testing pad regions located within the areas of the imcomplete integrated circuit portions which have been determined in step (d) to be acceptable.

* * * * *